United States Patent
Marek

(10) Patent No.: US 6,781,377 B2
(45) Date of Patent: Aug. 24, 2004

(54) NORMALLY CONDUCTING NMR RESONATORS WITH MACROSCOPICALLY HOMOGENEOUS DISTRIBUTION OF THE CONDUCTING MATERIAL

(75) Inventor: Daniel Marek, Moeriken (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 10/353,937

(22) Filed: Jan. 30, 2003

(65) Prior Publication Data

US 2003/0151409 A1 Aug. 14, 2003

(30) Foreign Application Priority Data

Feb. 12, 2002 (DE) ......................................... 102 05 625

(51) Int. Cl.$^7$ ................................................ G01V 3/00
(52) U.S. Cl. ..................................................... 324/318
(58) Field of Search ......................................... 324/318

(56) References Cited

U.S. PATENT DOCUMENTS

| | | | |
|---|---|---|---|
| 4,563,648 A | | 1/1986 | Hill .............................. 324/318 |
| 4,694,255 A | * | 9/1987 | Hayes ........................... 324/318 |
| 5,565,778 A | * | 10/1996 | Brey et al. .................... 324/318 |
| 5,619,140 A | * | 4/1997 | Brey et al. .................... 324/318 |
| 5,646,531 A | * | 7/1997 | Renz ........................... 324/318 |
| 5,689,188 A | * | 11/1997 | Claasen-Vujcic ........... 324/318 |
| 5,998,999 A | * | 12/1999 | Richard et al. .............. 324/318 |
| 6,100,694 A | * | 8/2000 | Wong ........................... 324/318 |
| 6,285,189 B1 | * | 9/2001 | Wong ........................... 324/318 |
| 6,420,871 B1 | * | 7/2002 | Wong et al. ................. 324/318 |
| 6,552,544 B2 | * | 4/2003 | Wong et al. ................. 324/318 |
| 6,556,013 B2 | * | 4/2003 | Withers ........................ 324/322 |
| 6,661,229 B2 | * | 12/2003 | Weyers et al. ............... 324/318 |

FOREIGN PATENT DOCUMENTS

WO    WO 96/39 636    12/1996

* cited by examiner

Primary Examiner—Christopher W. Fulton
(74) Attorney, Agent, or Firm—Paul Vincent

(57) ABSTRACT

An NMR resonator with RF resonator for receiving RF signals at a resonance frequency from a measuring sample in a volume under investigation of an NMR apparatus with a means for producing a homogeneous magnetic field $B_0$ in the direction of a z axis, wherein normally conducting conductor structures of the RF resonator which act inductively and partially also capacitively are disposed between $z=-|z_1|$ and $z=+|z_2|$ on a surface which is translation-invariant (=z-invariant) in the z direction at a radial (x, y) separation from the measuring sample, is characterized in that a compensation arrangement is additionally provided on the z-invariant surface, which extends to values of at least $z<-|z_1|-0.5|r|$ and $z>+|z_2|+0.5|r|$, wherein $|r|$ is the minimum separation between the measuring sample and the compensation arrangement, wherein the compensation arrangement comprises additional normally conducting conductor structures which are largely RF-decoupled from the RF resonator, with the conductor structures of the compensation arrangement and of the RF resonator being composed of individual surface sections ("Z-structures") which comprise normally conducting structures and which are disposed in the z-invariant surface to each extend in the z direction along the entire length of the conductor structures of the compensation arrangement and of the RF resonator, their structures being disposed such that, under decomposition of the surface of the Z structures into a plurality of equally sized surface elements, an equal mass of normally conducting material is contained in all surface elements which differ only with respect to their z position. This produces a new type of normally conducting NMR resonators whose additional conductor structures are decoupled from the actual RF resonator and which compensate for the disturbing influence caused by the susceptibility of the conductor.

23 Claims, 16 Drawing Sheets

PRIOR ART    PRIOR ART

NORMALLY CONDUCTING NMR RESONATORS WITH MACROSCOPICALLY HOMOGENEOUS DISTRIBUTION OF THE CONDUCTING MATERIAL

This application claims Paris Convention priority of DE 102 05 625.0 filed Feb. 12, 2002 the complete disclosure of which is hereby incorporated by reference.

BACKGROUND OF THE INVENTION

The invention concerns an NMR (nuclear magnetic resonance) resonator with at least one RF (radio frequency) resonator for emitting and/or receiving RF signals at one or more desired resonance frequencies to and/or from a measuring sample in an investigational volume, disposed about a coordinate origin (x,y,z=0), of an NMR apparatus with a means for producing a homogeneous magnetic field $B_0$ in the direction of a z axis, wherein normally conducting conductor structures of the RF resonator, which act inductively and partially also capacitively, are disposed between $z=-|z_1|$ and $z=+|z_2|$ substantially on a surface which is translation-invariant (=z-invariant) in the z direction at a radial (x,y) separation from the measuring sample.

An arrangement of this type is known from DE 34 14 559 [2].

The present invention concerns the field of high-resolution nuclear magnetic resonance (NMR), in particular the configuration of normally conducting resonators for receiving the NMR signal from the NMR measuring sample.

One of the main problems of normally conducting resonators is their magnetic susceptibility, i.e. the diamagnetic or paramagnetic properties of the conductor, which can strongly deteriorate the homogeneity of the static magnetic field in the measuring volume and therefore the resolution of the NMR spectrum. To prevent this, the conductors are generally configured from several material components with different diamagnetic and paramagnetic properties and the mass proportion in percent of the individual material components is selected such that the overall susceptibility of the conductor is exactly zero, if possible.

Despite this measure, a residual susceptibility usually remains which is produced through the existing tolerances for zero compensation of the overall susceptibility. A copper conductor is an example thereof. It is highly diamagnetic and its susceptibility value can be compensated for to approximately 1% of the copper value by adding paramagnetic material portions. Such precise compensation is however difficult to achieve during manufacture and generally increases the rejection rate. For this reason, it is desirable to find methods which produce satisfactory results even for large compensation errors.

It is the underlying purpose of the present invention to present a new type of normally conducting NMR resonators having additional conductor structures which are optimally decoupled from the actual RF resonator to optimally compensate for the disturbing influence produced by the susceptibility of the conductor.

SUMMARY OF THE INVENTION

This object is achieved in accordance with the invention in an NMR resonator having the above-mentioned features in that an additional compensation arrangement is provided on the surface which is translation-invariant in the z direction (=z-invariant), which extends to values of at least $z<-|z_1|-0.5|r|$ and $z>+|z_2|+0.5|r|$, wherein $|r|$ is the minimum separation between the measuring sample and the compensation arrangement, with the compensation arrangement comprising further conductor structures which are largely RF-decoupled from the RF resonator, wherein the conductor structures of the compensation arrangement and of the RF resonator are composed of individual surface sections ("Z-structures") which comprise conductor structures and which are disposed in the z-invariant surface to each extend across the entire length in the z direction of the conductor structures of the compensation arrangement and of the RF resonator and whose conductor structures are disposed such that, with suitable conceptual decomposition of the areas of the Z structures into a plurality of small, equally sized surface elements which differ only with respect to their z position, a largely identical mass of normally conducting material would be present in all of the surface elements.

In the inventive resonator, the individual normally conducting conductor portions which carry the radio frequency (RF) current and which therefore form the RF resonator are supplemented by additional normally conducting conductor portions which are disposed quasi continuously within the RF resonator, which extend beyond same in the z direction and which are, to the extent possible, RF-decoupled from the RF resonator such that they do not carry RF current. FIG. 9b shows an arrangement built according to this principle, wherein the RF resonator is shown with hatched lines and the additional conductor parts, which merely serve to homogenize the $B_0$ field in the active measuring region, are shown in black. Clearly, the conducting material is distributed fairly homogeneously within each one of the three vertical structure surfaces which are oriented parallel to the z axis to effect a uniform distribution of the dipole moments caused by the susceptibility of the conductor material. This produces a nearly vanishing disturbing field in the measuring volume such that the NMR spectrum is no longer significantly influenced.

The terms NMR resonator, RF receiver coil arrangement, and RF resonator will be mentioned several times in the following description. Their meanings are similar and they are therefore defined now to clearly distinguish them from another.

An NMR resonator represents the entire resonator arrangement. It is composed of one or more, preferably 2 or 4 RF receiver coil arrangements which are disposed around the measuring volume and which can be RF-coupled to one another. The RF receiver coil arrangement itself comprises the RF resonator and the compensation arrangement, wherein the RF resonator substantially represents that part of the RF receiver coil arrangement which carries the RF current.

In order to construct and analyze the inventive RF receiver coil arrangements, it is useful to conceptually divide their overall conductor structure into stripe surfaces parallel to the z axis, with each surface being formed from a single row of identical, small surface elements. To produce effective compensation of the susceptibility effect, identical amounts of magnetic dipole moment must be provided within each surface element of an individual strip, i.e. identical amounts of conductor material.

The smaller the elements of the conductor structure, the finer possible division of the total surface of the RF receiver coil arrangement into strips with identical, small surface elements. The smallest dimension of the surface elements must not be less than the smallest dimension of the structural elements since individual surface elements could otherwise fail to contain any conductor material at all thereby violating the condition of identical dipole moments per surface element. As fine a surface division as possible is required to minimize the waviness of the disturbing field in the active measuring region produced by the magnetic dipole moments of the conductor material in the individual surface elements. Reasonably fine division can be obtained when the total number of the surface elements is larger than 50, preferably larger than 200.

The most important aspect of this divisioning is the number of identical surface elements which differ only with regard to their z position, i.e. disposed on strips oriented parallel to the z axis. This number should be larger than 20 and preferably larger than 50.

In one particularly preferred embodiment of the inventive RF receiver coil arrangement, the conductor structures of the compensation arrangement project past both sides of the RF resonator by at least half, preferably approximately twice, the extension of the RF resonator in the z direction. The edge regions of the compensation arrangement which are mainly responsible for the disturbing influences in the active measuring region are thereby spatially moved as far from the active measuring region to preclude significant influence at that location.

NMR resonators are usually composed of several RF receiver coil arrangements in order to optimize the filling factor. In an advantageous embodiment of the invention, the NMR resonator therefore contains several coupled RF receiver coil arrangements, preferably 2 or 4 on different partial regions of the z-invariant surface.

In one embodiment of the invention which is particularly simple with respect to geometry and production, the conductor structures of the RF resonator(s), which act inductively and partially also capacitively, and the conductor structures of the compensation arrangement(s) are both disposed on planar substrate elements which are oriented parallel to each other and to the z axis.

One obtains a particularly good filling factor when the inductively and partially also capacitively acting conductor structures of the RF resonator(s) and the conductor structures of the compensation arrangement(s) are disposed on cylindrical substrate elements which are concentric to each other and which are arranged parallel to the z axis.

One embodiment of the inventive RF receiver coil arrangement is particularly simple to produce wherein the inductively and partially also capacitively acting conductor structures of the RF resonator and the conductor structures of the associated compensation arrangement are disposed in the same plane or on the same cylindrical surface.

An alternative embodiment is characterized in that the conductor structures of the RF resonator and the associated compensation arrangement are disposed on two or more flat or cylindrical partial surfaces which are parallel or concentric to one another, wherein the first partial surface comprises the inductively and partially also capacitively acting conductor structures of the RF resonator and parts of the associated conductor structures of the compensation arrangement and the remaining parts of the conductor structures of the compensation arrangement are disposed in the other partial surfaces. This somewhat complicated arrangement produces a further physical degree of freedom which permits very exact compensation of the disturbing influence produced by the susceptibility of the conductor structures.

In a further development of this embodiment, the separations between the partial surfaces, measured in a direction perpendicular to the partial surfaces are not more than 600 $\mu$m, preferably not more than between 50 and 200 $\mu$m. These separations must be kept as small as possible to minimize errors in the compensation of the susceptibility influence.

One simple embodiment of the invention is particularly preferred wherein the conductor structures of the compensation arrangement and of the RF resonator are disposed on the same partial surface of the z-invariant surface. A plurality of further embodiments, which are characterized by their simple construction, can be derived from this embodiment.

In a further particularly preferred very simple embodiment of the invention, at least part of the conductor structure sections is disposed like strips which are either parallel or perpendicular to the z axis. This embodiment has a simple geometrical shape and serves as a starting point for the production of different z structures.

In one embodiment which increases variation options, the conductor structures on the z-invariant surfaces have different geometric shapes, e.g. strips of different orientation and width and squares, circles, trapezoids etc. This increases the flexibility for design of the overall geometry to further optimize error compensation.

A very useful Z structure which can be used individually or multiply in an inventive RF receiver coil arrangement consists of identical, narrow conductors which are disposed at close intervals, periodically and continuously in the z direction, wherein the separation between neighboring conductors is small compared to the smallest separation $|r|$ from the investigational volume.

A further very useful Z structure which can be applied individually or multiply in an inventive RF receiver coil arrangement, consists of individual conductors which are oriented parallel to the z axis and have identical or different mutual separations.

In one embodiment of the inventive RF receiver coil arrangement, the conductor structures which do not belong to the RF resonator contain a number of narrow interruptions which are distributed over parts or over the entire length of the individual conductor sections. This considerably improves RF decoupling between the RF resonator and the compensation arrangement since the currents which are usually produced in the conductor structures are minimized or suppressed by the interruptions.

In a further embodiment of the invention, the RF resonator is produced from the desired regions of the Z structures in that the conductor or parts thereof is/are rotated or displaced within small surface elements of the Z structures, and/or narrow separations between the conductors are galvanically connected and/or narrow interruptions are fashioned in the conductors and/or inclined Z structures are used and/or the Z structures are distributed over two or more partial surfaces.

A very concrete, particularly preferred embodiment which has a relatively simple geometrical structure is characterized in that the RF receiver coil arrangement is formed of three Z structures, two with vertical strips on the left and on the right and one with horizontal straight strips in the middle.

In another embodiment of the invention which provides very exact compensation and many variation possibilities, the entire RF receiver coil arrangement is disposed in two planes and is composed of three Z structures, i.e. of a first and second structure with strips arranged parallel to the z axis at a defined mutual separation and a third structure with strips disposed periodically in z and transverse to the z axis, wherein the third Z structure is positioned above the first two structures and precisely covers these, wherein the RF resonator and the compensation structure are generated in that the three Z structures are partially decomposed and distributed on two separate partial surfaces which belong to one or two substrates, wherein the first partial surface contains the entire RF resonator with the main part of the compensation structure and the second partial surface contains the remaining part of the compensation structure, and the structures produced in this fashion are positioned on top of each other on the two partial surfaces such that the sum of their structures is once more equal to the sum of the original three Z structures, thereby producing an operative NMR resonator.

Further advantages can be extracted from the drawings and the description. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWING

FIG. 8b shows the resulting conductor structure after displacement and turning of some surface portions as shown in FIG. 8a;

DESCRIPTION OF THE PREFERRED EMBODIMENT

The function of the inventive embodiments is explained to a further extent below.

A strip of conducting material has, in general, a finite magnetic susceptibility which is caused by the magnetic dipoles in the material. These dipoles are polarized in the static magnetic field $B_0$ in which the material is located, and distort the surrounding field and therefore also the quality of the NMR spectrum. The NMR spectrum is influenced only by the field components which are oriented parallel to the $B_0$ field within the active measuring volume. The x and y components, which are oriented perpendicular to the $B_0$ field, can be neglected.

This susceptibility is also present when the material is composed of approximately equal mass proportions of paramagnetic and diamagnetic portions, wherein in this case, the resulting susceptibility may be very small, e.g. only one to a few percent of the susceptibility of copper, but still large enough to negatively influence a high-resolution NMR spectrum.

It is therefore the underlying purpose of the present invention to present new methods which further reduce the influence of the susceptibility, including cases in which the susceptibility of the material used was not precisely or not at all compensated for through appropriate paramagnetic and diamagnetic material portions. These new methods should not directly influence the susceptibility of the material (these remain unchanged) but shall considerably reduce the influence of the susceptibility of the material on the NMR spectrum through suitable geometric configuration of the NMR resonator.

Figure 3:
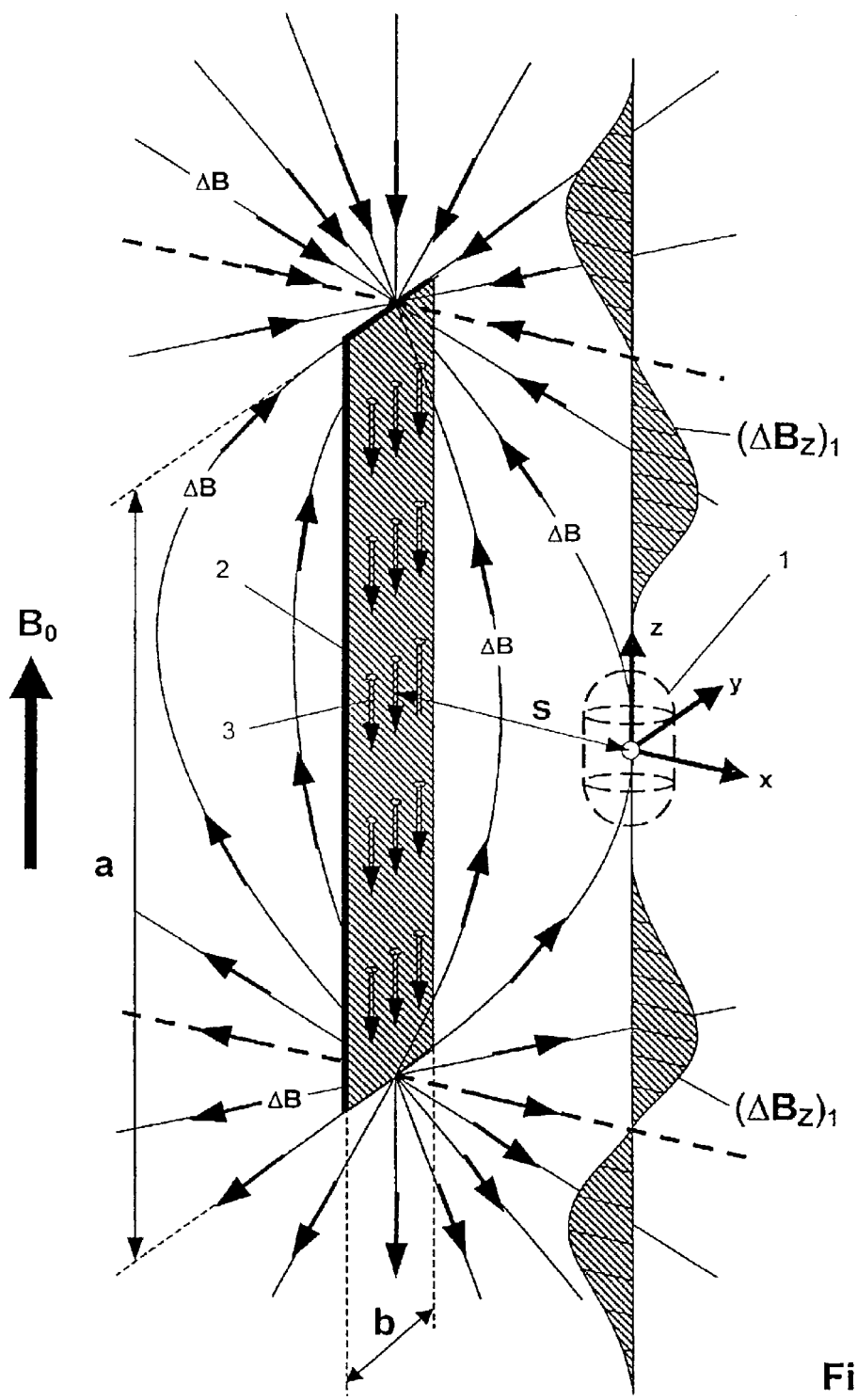
FIG. 3 shows the field $\Delta B$ which is produced by a diamagnetic conductor strip with a longitudinal axis parallel to $B_0$. The z component $(\Delta B_z)_1$ of the field $\Delta B$ is practically zero in the region of the active measuring volume 1 and occurs only at the upper and lower margin of the strip.

If the conductor strip is oriented exactly parallel to the $B_0$ field, all internal magnetic dipoles are oriented parallel to the longitudinal axis of the strip. The total influence of these dipoles can be represented by a plurality of positive or negative magnetic monopoles (FIG. 3) which are located exclusively at one or the other end of the strip and which produce a disturbing field $\Delta B$ which is noticeable only in the region of these two ends. If the two ends of the strip have a large mutual separation, i.e. if the smallest distance between the active measuring volume and the two ends of the strip is large compared to the separation s between the center of the active measuring volume and the strip, there are practically no disturbing components in the region of the active measuring volume (see $\Delta B_z)_1$).

If the strip is not oriented exactly parallel to the $B_0$ field, in addition to the magnetic dipoles which are oriented parallel to the surface of the strip, dipoles also occur which are oriented perpendicular to the surface. The latter can be neglected compared to the former, since their effect is smaller by orders of magnitude due to the small angle of inclination of the strip with respect to the $B_0$ field. For this reason, it can be assumed that the conductor strip is oriented exactly parallel to the $B_0$ field and contains only magnetic dipoles which are oriented parallel to the surface of the strip.

There are five principal findings which have led to the present invention and which are used in the following order:
1. Only the disturbing components parallel to the static field $B_0$ must be taken into consideration.

In NMR spectroscopy, the resonance frequency depends on the absolute magnitude of the magnetic field at the location of the measuring sample. This absolute magnitude is composed of the vectorial sum of the strong static magnetic field $B_0$ and the three much weaker disturbing components $\Delta B_X$, $\Delta B_Y$ and $\Delta B_z$. Since the two disturbing components $\Delta B_X$ and $\Delta B_Y$ are perpendicular to the $B_0$ field, they have a negligibly small influence on the absolute magnitude compared to the component $\Delta B_z$ which is oriented parallel to $B_0$. For this reason, it is sufficient for NMR observations to only consider the $B_z$ component of the disturbing field.
2. Conductor strips parallel to the static magnetic field $B_0$ produce Bz components only at their two ends.

A thin conductor strip of susceptibility $\chi_L$ whose longitudinal axis is oriented parallel to the $B_0$ field (FIG. 3) has internal magnetic dipoles which are all oriented parallel to the $B_0$ field and hence also parallel to the surface of the strip. This produces magnetic monopoles at each end causing an inhomogeneous field and therefore also inhomogeneous $B_z$ components in the region of these two ends. If these two ends have a large mutual separation, i.e. when the smallest separation of the active measuring volume from the two ends of the strip is large compared to the separation s between the center of the active measuring volume and the strip, practically no field inhomogeneities are produced in the region of the active measuring volume and therefore practically no influence on the NMR spectrum.
3. Conductor strips which are oriented either perpendicular or inclined to the static magnetic field $B_0$ but which repeat periodically and continuously over a longer path in the direction of the $B_0$ field, form a structure which is macroscopically homogeneous in the z direction and which produces significant $B_z$ components only at their two ends, in the z direction.

Figure 4:
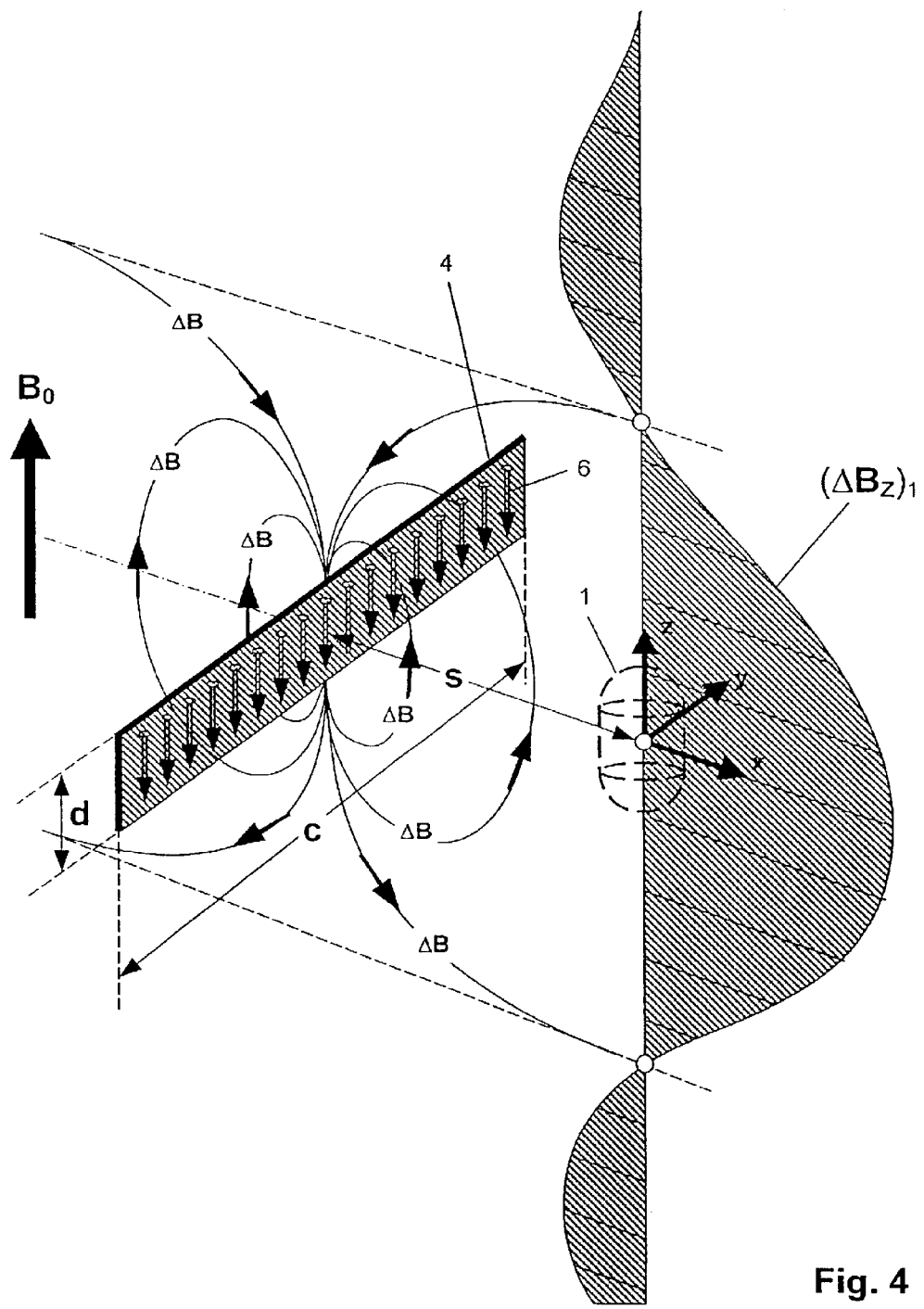
FIG. 4 shows the field $\Delta B$ which is produced by a diamagnetic conductor strip whose longitudinal axis is perpendicular to $B_0$. In the region of the active measuring volume 1, the z components $(\Delta B_z)_1$ of the field $\Delta B$ are highly inhomogeneous.

A conductor strip of susceptibility $\chi_L$, length c and width d, wherein d is small compared to the smallest separation between the active measuring volume and the strip, and wherein the longitudinal axis is perpendicular and the transverse axis is parallel to the $B_0$ field, has internal magnetic dipoles which are all oriented parallel to the $B_0$ field and therefore also parallel to the surface of the strip. This leads to magnetic monopoles at both longitudinal edges which produce an inhomogeneous field and also inhomogeneous $B_z$ components in the region of these two longitudinal edges. Since the two longitudinal edges are close to each other, strong inhomogeneous $B_z$ components also occur in the region of the active measuring volume (=$(\Delta B_z)_1$ in FIG. 4).

If a plurality of such strips are uniformly and closely successively disposed in the z direction (FIG. 5) a strip structure is obtained which is periodically continuous in the z direction which produces, in its central region i.e. in the region of the active measuring volume, practically no $B_z$ components. The reason therefor is that only the outermost longitudinal edges of the two conductor strips located at the ends of the strip structure have monopoles which are not compensated for. All other longitudinal edges within the strip structure also have monopoles which compensate mutually if certain conditions are met.

Figure 5:
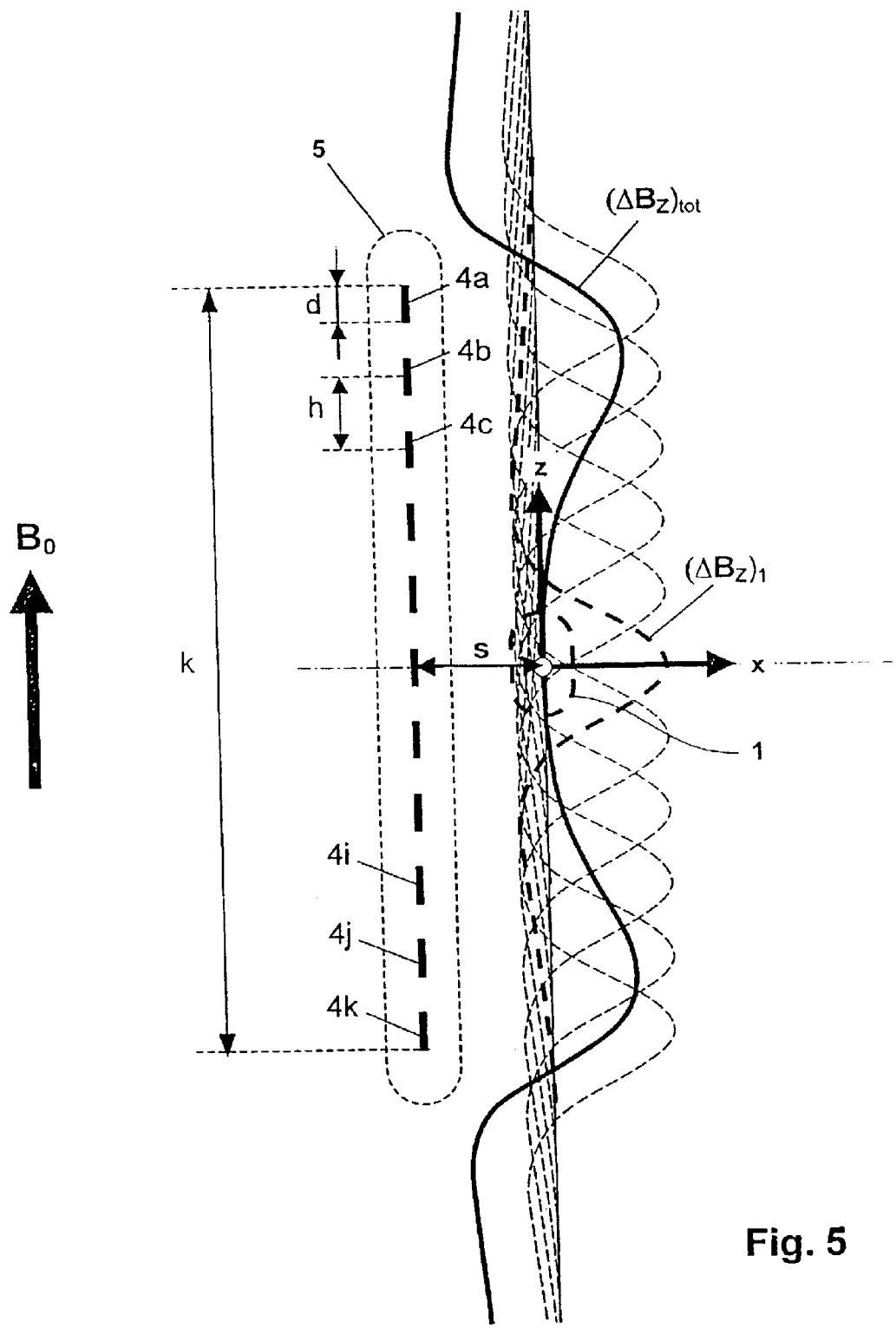
FIG. 5 shows an arrangement of several conductor strips 4a, 4b, 4c to 4k which are disposed on a plane parallel to $B_0$ and disposed uniformly on top of each other. The $B_z$ component $(\Delta B_z)_1$ of the individual strips overlap and produce the field $(\Delta B_z)_{tot}$. It is practically zero in the region of the active measuring volume 1 and has only very small $B_z$ components which can be easily compensated for by means of the room temperature shim system. Stronger $B_z$ components occur only in the region of the upper and lower ends of the strip, i.e. in a region which has practically no influence on the active measuring volume.
Figure 6A:
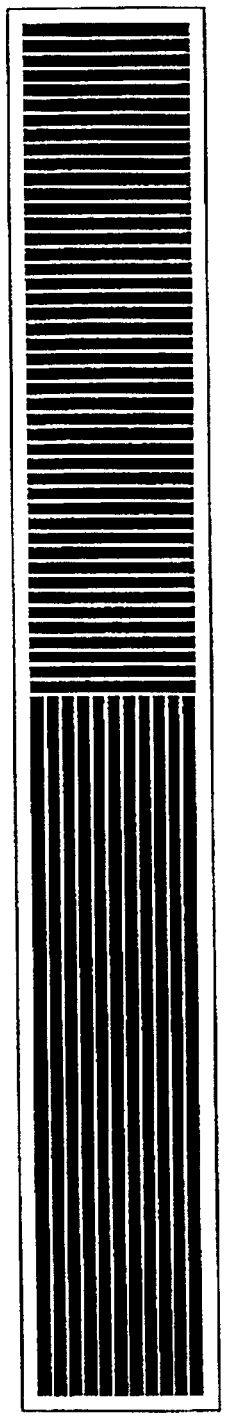
FIG. 6a shows a conductor structure composed of strips oriented parallel and perpendicular to the $B_0$ field. The strips are distributed such that the same amount of conductor material is present in each surface element. Disturbing fields can only thereby be generated at the upper and lower edge of the overall conductor structure.
Figure 6B:
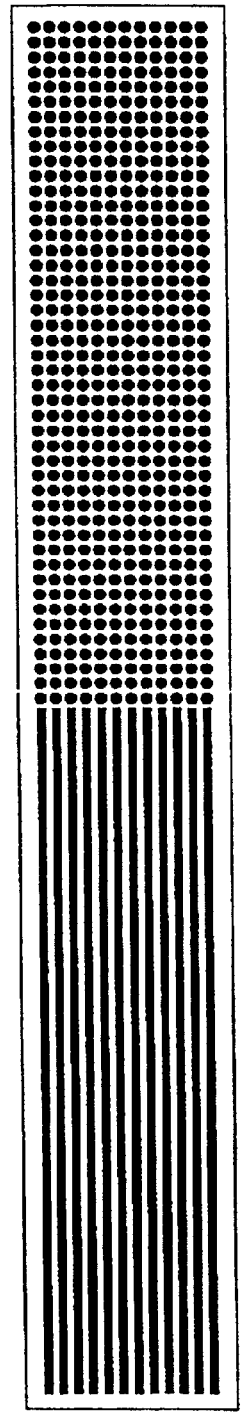
FIG. 6b shows a conductor structure which is composed of strips oriented parallel to the $B_0$ field and circular conductor dots. The strips and conductor dots are distributed such that the same amount of conductor material is present in each surface element. For that reason, disturbing fields can occur only at the upper and lower edge of the overall conductor structure.

FIG. 5 shows an example of a strip structure with 11 such strips which are stacked on top of each other at equal separations on a plane parallel to the z axis. The resulting $B_z$ field is given by the curve $(\Delta B_z)_{tot}$. As long as the separation h between the strips is small compared to the separation s between the strip structure and the center of the active measuring volume (this condition was not met in FIG. 5 for illustrative reasons) and as long as the length k of the strip structure in the z direction is large compared to the separation s, the $B_z$ inhomogeneities produced by the individual strips mutually compensate and substantially cancel in the region of the active measuring volume such that a very homogeneous volume with essentially only a small quadratic gradient is produced at that location which can be easily compensated for with the shim system. Larger $B_z$ inhomogeneities are only present at the upper and lower ends of the strip structure.

If the separation h of the strips is no longer small compared to the separation s between the center of the active measuring volume and the strip structure, the periodicity of the strip structure can produce wavy $B_z$ components in the region of the active measuring volume which can no longer be properly compensated for with the shim system and which would therefore excessively distort the NMR spectrum.

This finding is true not only for strips oriented perpendicular to the z axis (FIG. 5) but also for those which are inclined with respect to the z axis or also for any other structure which is periodic in the z direction.

4. If conductor portions are rotated or displaced within small surface elements, the magnetic field produced by them remains nearly unchanged at the location of the active measuring region.

Any conductor structure with a susceptibility of $\chi_L$ formed on a support surface can be divided into a network of small equal square surface elements whose side length is small compared to the separation from the center of the active measuring region.

The conductor in the individual surface element has numerous microscopically small magnetic dipoles which are oriented parallel to the $B_0$ field. Since these dipoles are in a surface region which is small compared to the separation from the center of the active measuring region they may be combined into one single substitute dipole at the center of the surface element, wherein the effect on the field at the location of the active measuring region remains unchanged.

The conductor in the individual surface element can now be rotated and displaced and even its geometrical shape can be changed without changing the field in the active measuring region, the sole condition being that the mass of the conductor and therefore the number of the microscopically small dipoles in the surface element remains the same.

5. The influence of individual, narrow interruptions in the conductor strips can be neglected.

Individual interruptions in the conductor strips have no noticeable influence on the $B_z$ homogeneity in the active measuring region. An interruption can be regarded as overlapping of a volume region with oppositely polarized dipoles. Since the volume of the interruptions is generally very small, its substitute dipole will also be very small such that its influence on the field in the active measuring volume can be neglected.

The above findings show that conductor structures whose width is constant and whose length is large compared to the active measuring region and which have a longitudinal axis oriented parallel to the $B_0$ field and a distribution of the conductor parts which is macroscopically homogeneous in the z direction, only produce $B_z$ components at the upper and lower ends of the conductor structures but practically none in the central region where the measuring sample is located. These conductor structures must be sufficiently long that the fields produced at the ends generate a negligibly small disturbing field in the active measuring region.

Figure 1:
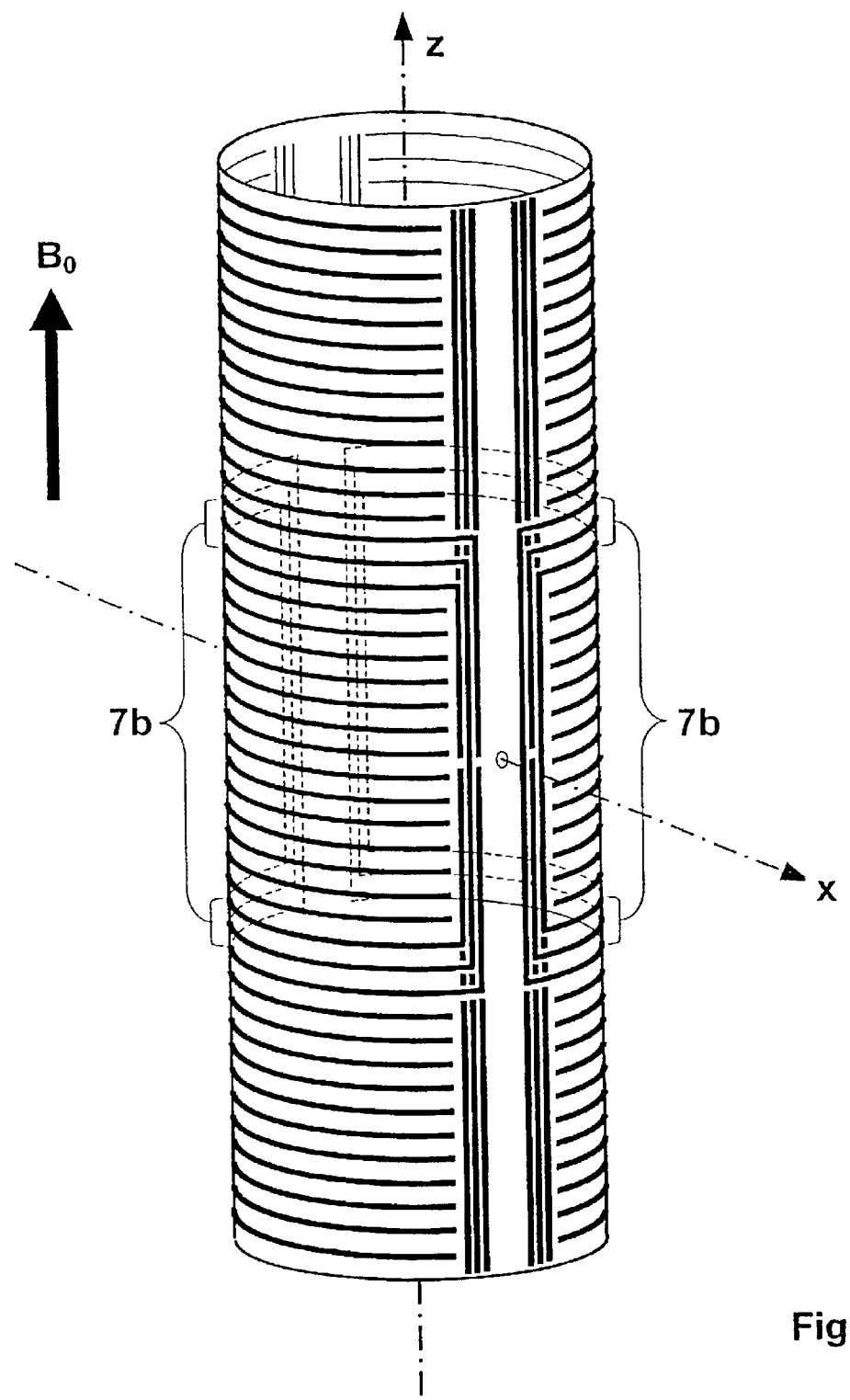
FIG. 1 shows an embodiment of the inventive NMR resonator, wherein the conductor structures are disposed on a cylindrical surface. The usual electric interruptions in the compensation structures which improve RF decoupling between these structures and the structures of the RF resonator are not shown.
Figure 2A:
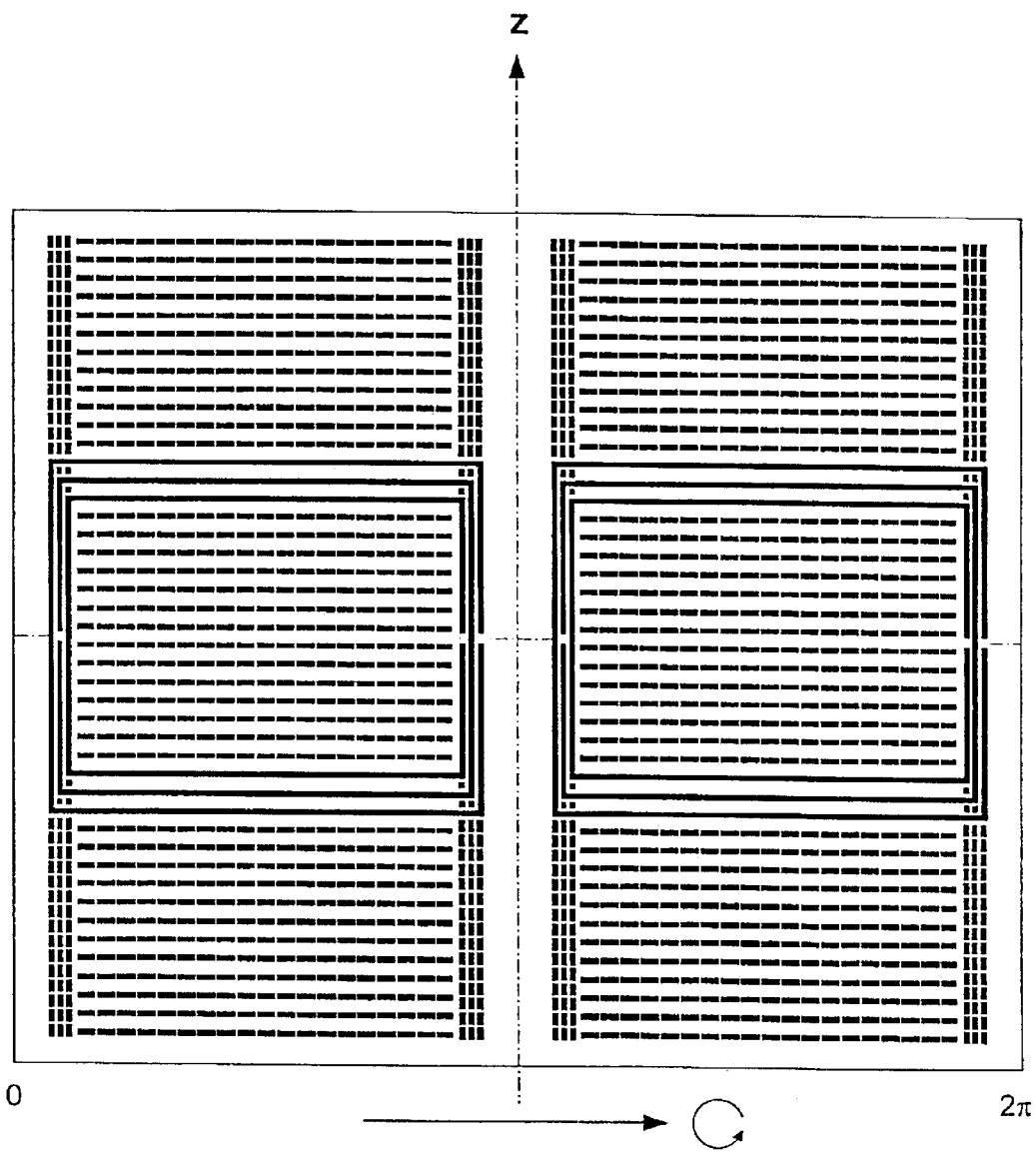
FIG. 2a shows the NMR resonator of FIG. 1, unwound onto a plane. The electric interruptions mentioned in FIG. 1 are clearly shown herein.
Figure 2B:
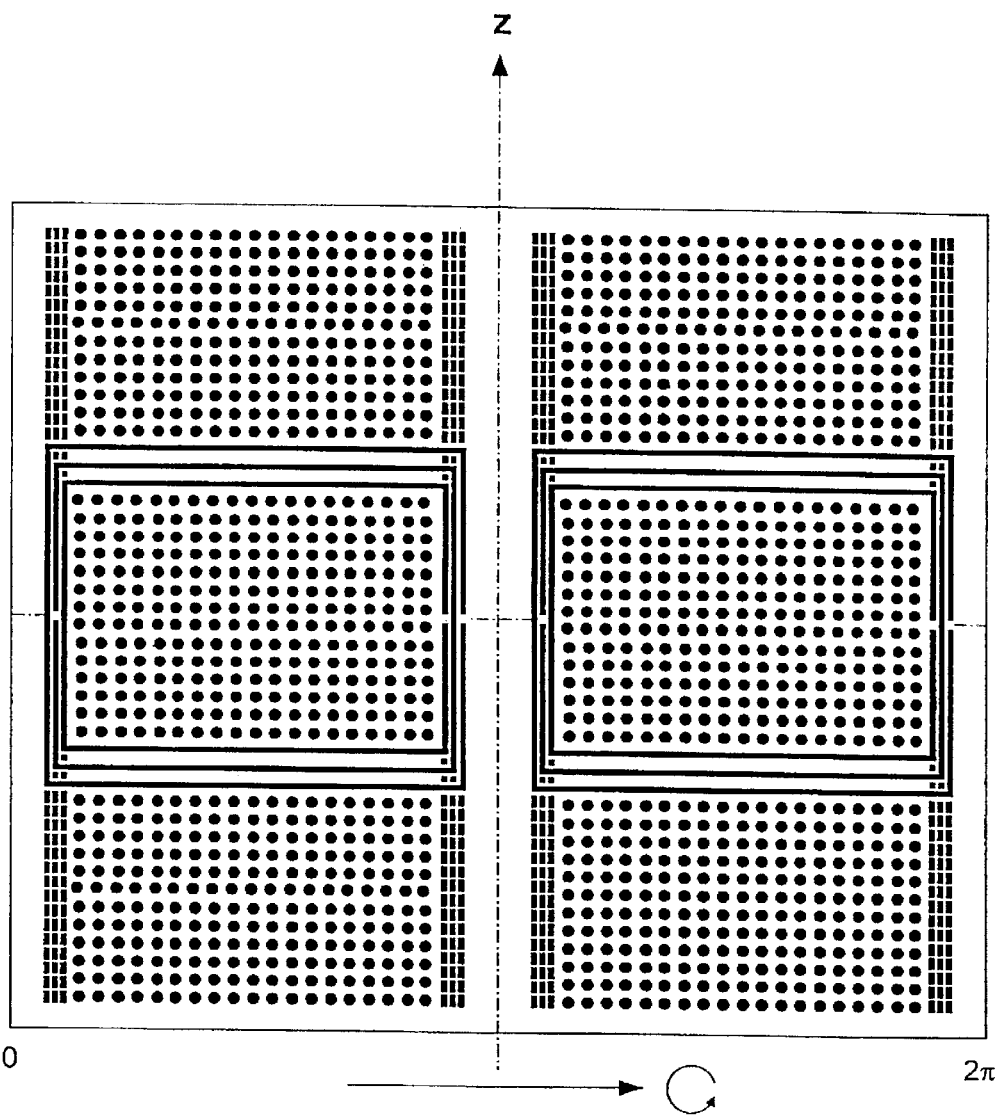
FIG. 2b shows a further possible compensation structure, i.e. with dot conductors instead of straight conductors. The mass portion per surface element of the dot and horizontal conductors which differ only with respect to their z position must be equal along the surface elements to obtain optimum compensation of the susceptibility of the conductor.

A distribution of the conductor parts which is macroscopically homogeneous in the z direction can be obtained by dividing the surface of the entire conductor structure into a grid of identical square surface elements whose side length is small compared to the smallest separation from the active measuring region, wherein the conductor is distributed on the individual surface elements such that all surface elements which differ only with respect to their z position, contain a largely identical mass of normally conducting material. This can produce conductor structures which are composed e.g. of different geometrical shapes, e.g. of strips having different orientations and widths and of squares, circles, trapezoids etc. without these conductor structures producing disturbing fields in the active measuring region. Examples of such conductor structures are shown in FIGS. 2a and 2b.

The above-mentioned conductor structures can also consist of identical narrow conductor sections which are disposed close to each other and are periodical and continuous in the z direction. The conductor sections must be sufficiently close to each other that the waviness of the disturbing field produced by them is negligibly small in the active measuring region.

If the conductor sections extend straight within the conductor structure and are oriented parallel to the $B_0$ field, and additionally extend across the entire length in the z direction of the conductor structure, they must not exhibit periodic and continuous sequences but can have any separation from each other transverse to the z direction, since none of the individual conductor sections itself produces inhomogeneities in the active measuring region.

These above-described conductor structures will be referred to as "Z structures". The present invention is based on several such Z structures which are disposed close to each other and/or on top of each other, and constructs a desired RF resonator from a certain region of these conductor structures. The remaining portion of these conductor structures only contributes to compensation of susceptibility of the RF resonator and, in the ideal case, should not carry any RF current. RF current should only flow in the RF resonator and it must therefore be optimally RF-decoupled from the other conductors.

To construct the RF resonator from the Z structures, individual selected conductor parts are rotated or displaced within their surface elements according to finding 4 and individual conductor sections are connected or disconnected.

The remaining part of the Z structure which does not belong to the RF resonator can also be modified according to finding 4 wherein e.g. vertical conductor arrangements can be changed into horizontal arrangements to thereby reduce RF coupling to the RF resonator.

Two important points should be mentioned herein with regard to the Z structures:

1. The Z structures do not have to be disposed in one plane, they can be realized on any surface which is invariant in z, in particular, on cylindrical surfaces.
2. The Z structures must have a constant width across z, however, the two ends in the z direction can have any shape, e.g. inclined or curved. Since these ends are far away from the active measuring region, they have no influence on the field homogeneity in the measuring region.

The above described principles permit a large number of possible embodiments, only several of which will be described. All of the following embodiments are based on three Z structures only, two with conductor sections parallel to the $B_0$ field and one perpendicular to the $B_0$ field which are disposed on a z-invariant surface at a radial (x,y) separation from the measuring sample. These surfaces can, in particular, be flat or cylindrical.

Figure 7A:
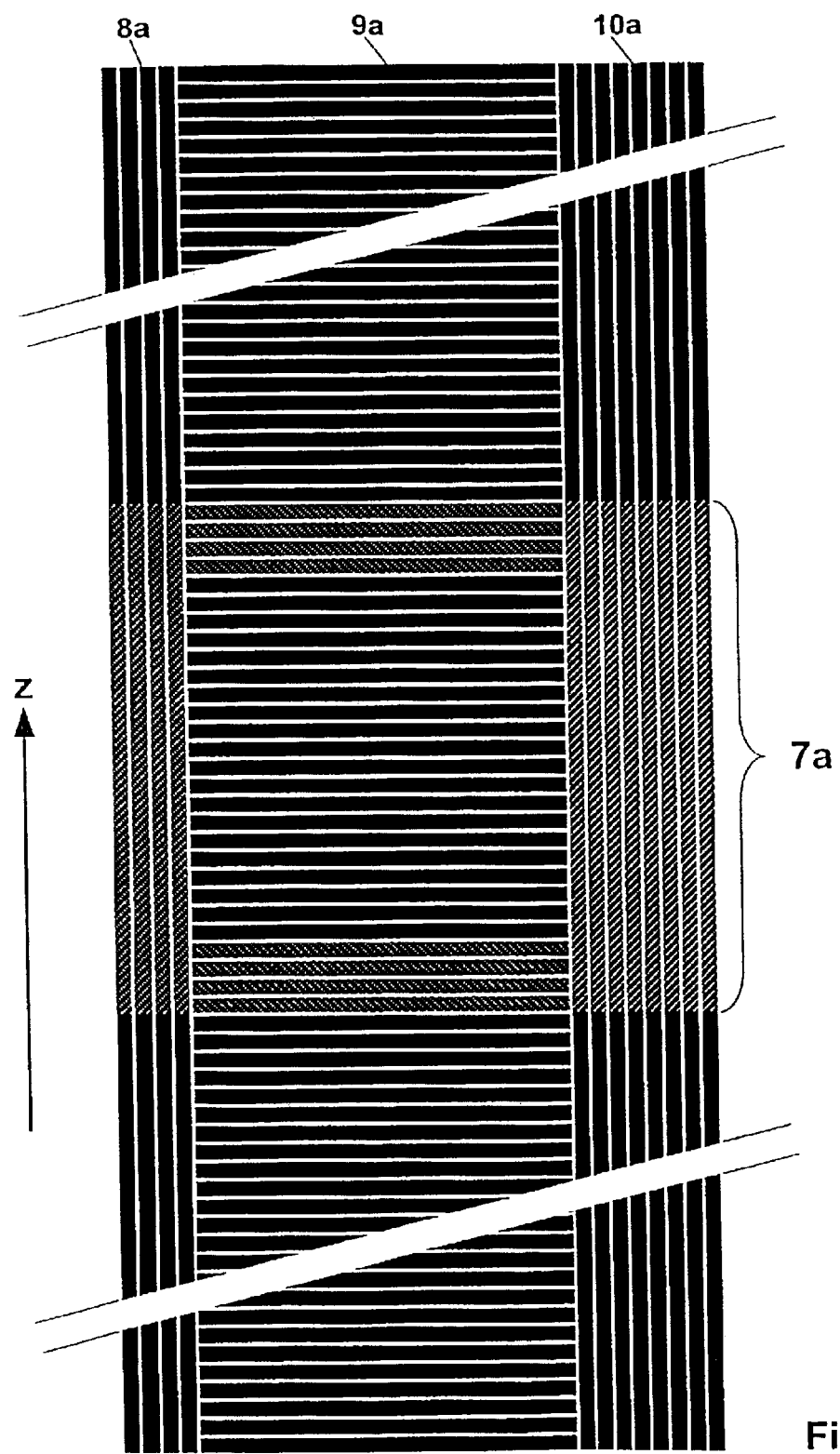
FIG. 7a shows a conductor structure having a constant width, which is strongly extended in the z direction and formed from three partial structures, i.e. two with strips parallel to the $B_0$ field and a central with strips perpendicular to the $B_0$ field. The RF resonator can be designed from the hatched region 7a. The remaining regions are required to compensate for the susceptibility influence of the RF resonator.

First Embodiment:

In the first embodiment of the inventive idea, the first Z structure consists of strips parallel to the $B_0$ field directly followed by a second structure with strips perpendicular to the $B_0$ field, which is again directly followed by a third structure with strips parallel to the $B_0$ field. FIG. 7a shows an example thereof, wherein the three Z structures are disposed on a plane and selected such that an RF resonator of the type of FIG. 10a in patent [1] can be produced therefrom. The region of the Z structures from which the RF resonator is to be produced is hatched in FIG. 7a (region 7a). The predominantly field-generating conductors are produced from the left Z structure 8a which is the closest to the measuring sample. The upper and lower transverse conductors are produced from the central structure 9a and the capacitive portions are produced from the right structure 10a. The right conductor structure 10a has twice as many conductors as the left conductor structure 8a to permit production of the capacitive portions.

The principal problem is production of the corners of the RF resonator which must be produced from the hatched parts of the conductor structures 8a and 10a (FIG. 7a). This problem is solved by rotating or displacing certain hatched conductor portions within their associated surface elements which is permitted according to finding 4.

Figure 8A:
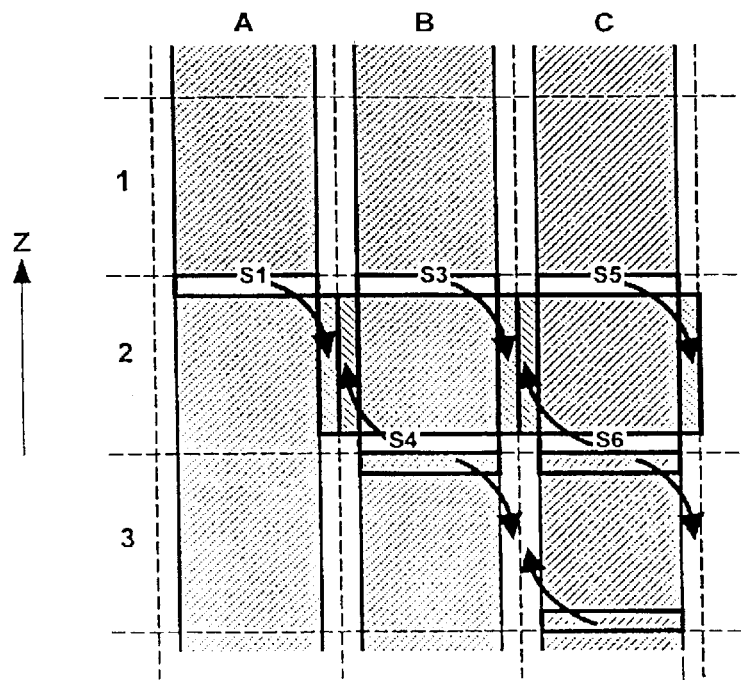
FIG. 8a shows a section of the upper end of the hatched part of the partial structure 8a in FIG. 7a. The illustration shows how e.g. surface portions s1, s3, s4, s5 and s6 of the conductor structure must be displaced and turned within the associated surface elements A2, B2, or C2, to construct a corner of the RF resonator.
Figure 8B:
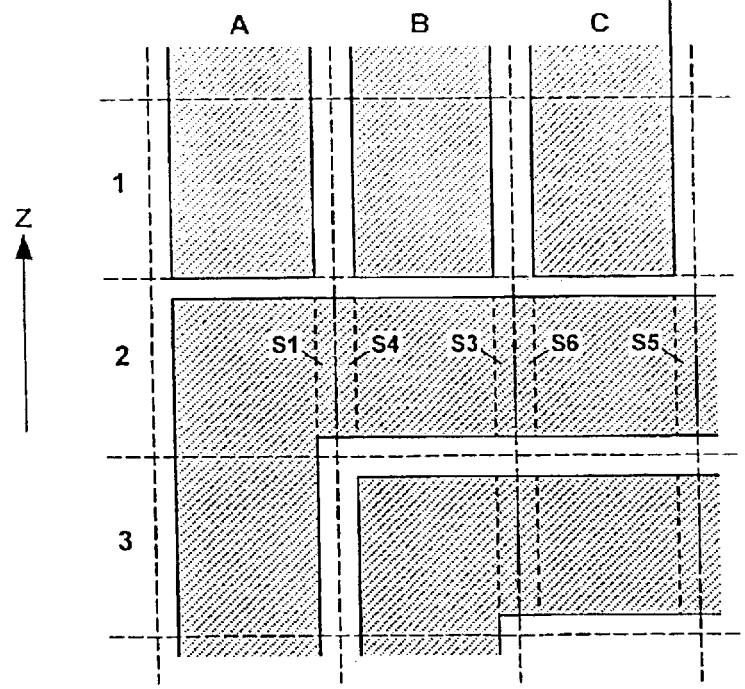

FIG. 8a shows the solution of this problem. On the basis of three conductors with the surface elements (A1+A2+A3), (B1+B2+B3) or (C1+C2+C3), the conductor parts S1, S3, S4, S5 and S6 are rotated and displaced within the surface elements A2, B2 and C2 such that a first corner of the RF resonator is produced. A second corner is produced analogously within the surface elements B3 and C3. The result of this transformation is shown in FIG. 8b.

Figure 9A:
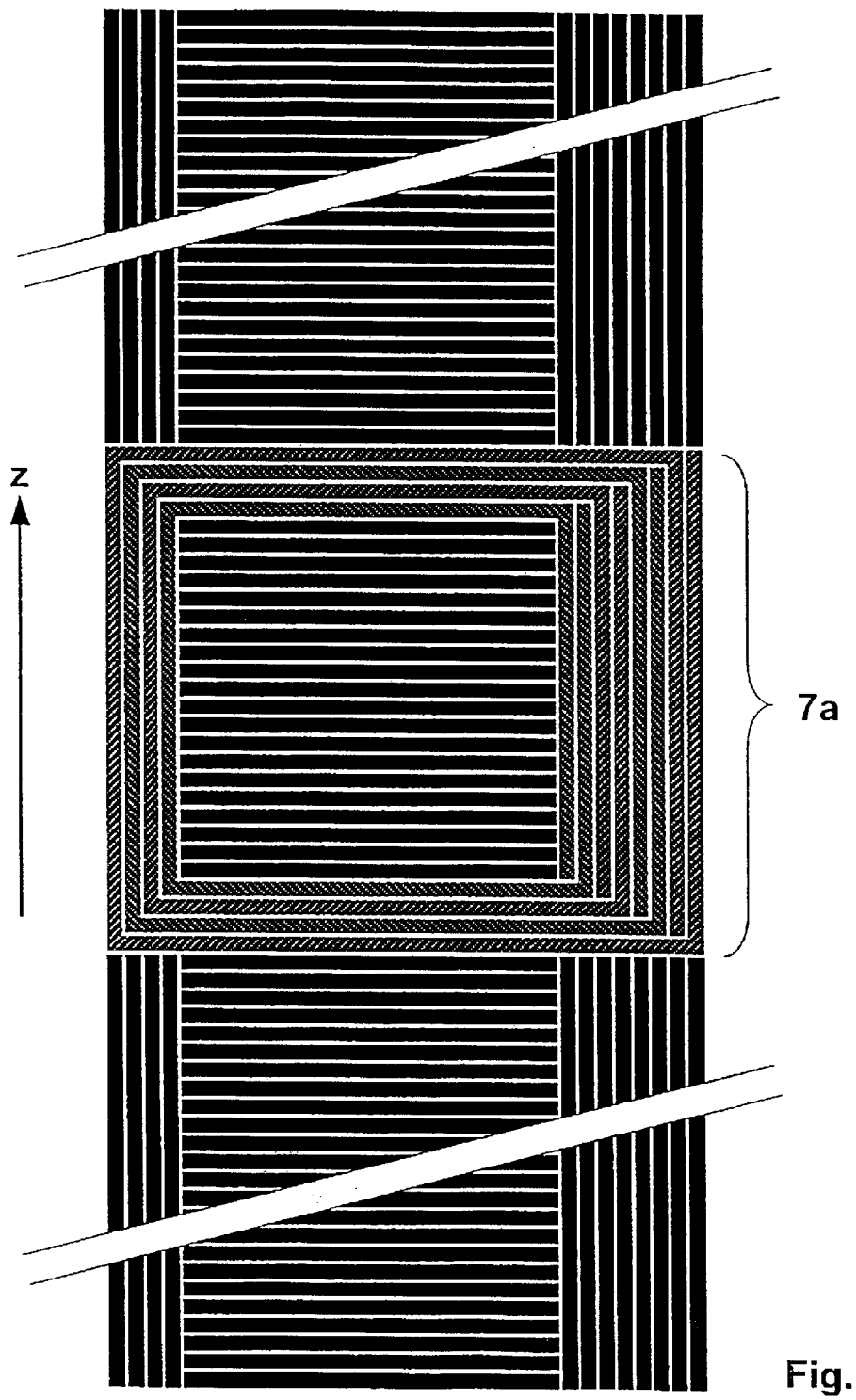
FIG. 9a shows the first embodiment of an inventive resonator which was produced from the hatched structure of FIG. 7a by using the transformation process of FIG. 8a. The region 7a in which the RF current flows, is hatched. The overall conductor structure produces practically no disturbing fields in the active measuring region.

After production of all corners in accordance with the above described instructions, one obtains the overall structure of the RF resonator (hatched surface in FIG. 9a). It is nearly magnetically identical to the hatched surface of FIG. 7a and therefore does not produce any disturbing $B_z$ components in the active measuring region.

The conductor structure of FIG. 9a has the disadvantage that the RF field lines of the RF resonator must penetrate through the compensation structure of closely adjacent horizontal strips and meet strong resistance since only small gaps are provided for passage of the field lines. In particular, the horizontal strips in the region 7a which are surrounded by the RF resonator must permit passage of the highest concentration of field lines and therefore form the largest impediment.

Figure 7B:
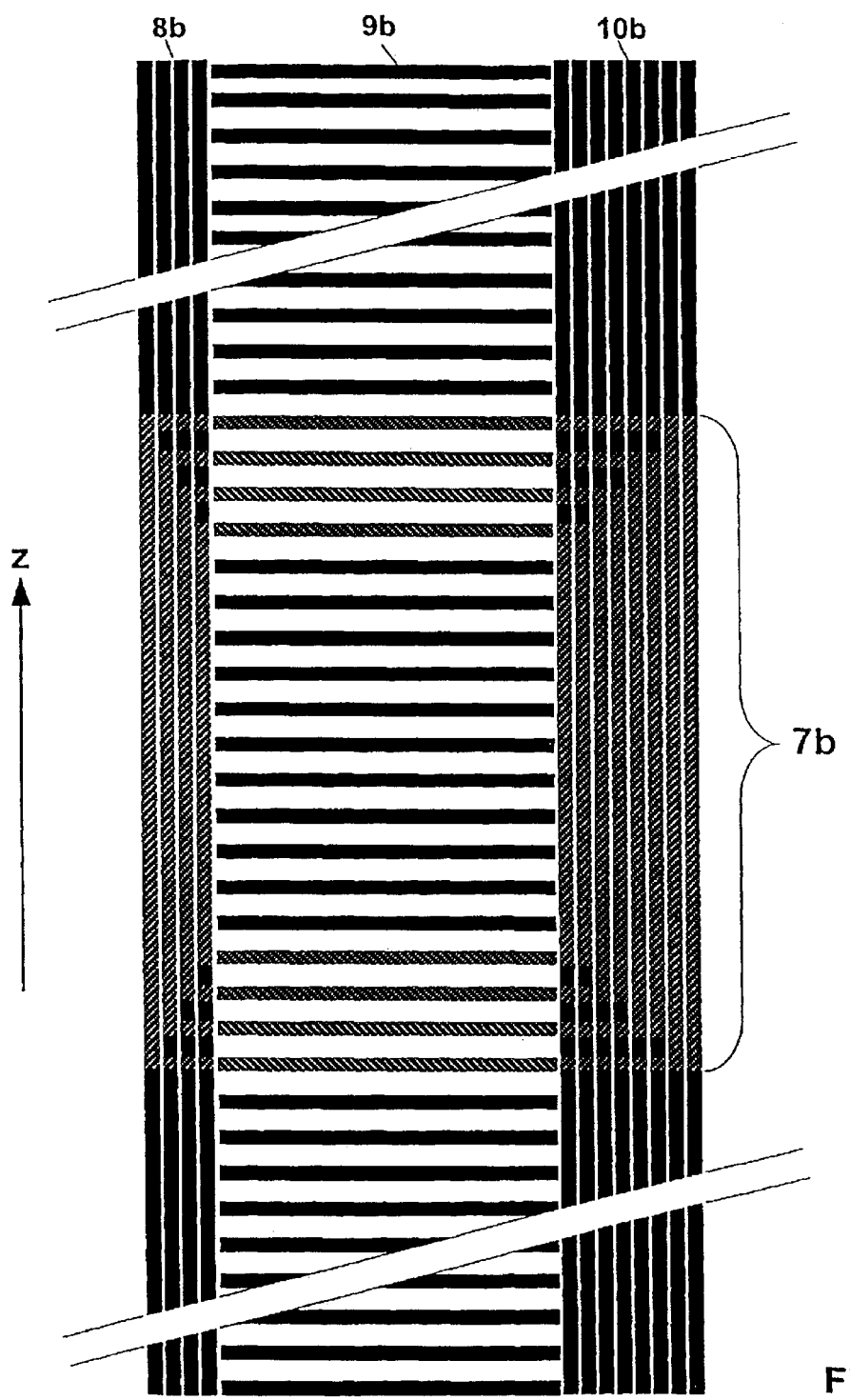
FIG. 7b shows a conductor structure similar to FIG. 7a, however, with the difference that the strips of the central partial structure have larger separations from each other which improves the RF transparency of this partial structure.

Second Embodiment:

In order to minimize the disadvantage of the first embodiment, in a second embodiment of the inventive idea, the central conductor structure 9a of FIG. 7a is replaced by the "more transparent" conductor structure 9b of FIG. 7b. Carrying out of the above-described transformation produces the structure of FIG. 9b which is substantially "more transparent" for the RF field lines and therefore has better RF properties.

Third Embodiment:

There are more variation possibilities when the Z structures of an RF receiver coil arrangement are distributed not on one single but two closely adjacent coinciding surfaces. Conductor structures can be configured by means of the additional surface which would otherwise lead to conductor intersections and overlappings in one single surface. If the separation between the two complementary surfaces is small compared to the separation of these surfaces from the center of the active measuring volume, all considerations concerning the compensation of the susceptibility of the conductors can be made with the assumption that the two surfaces are melted into one single common surface.

The two surfaces can be separated from each other e.g. through a thin, electrically insulating sheet or one of the electrically insulating support elements on which one of the two surfaces rests could assume the function of the insulating sheet.

It should also be noted that the two surfaces can be regarded as parts of a common z-invariant surface.

Figures 10A, 10B:
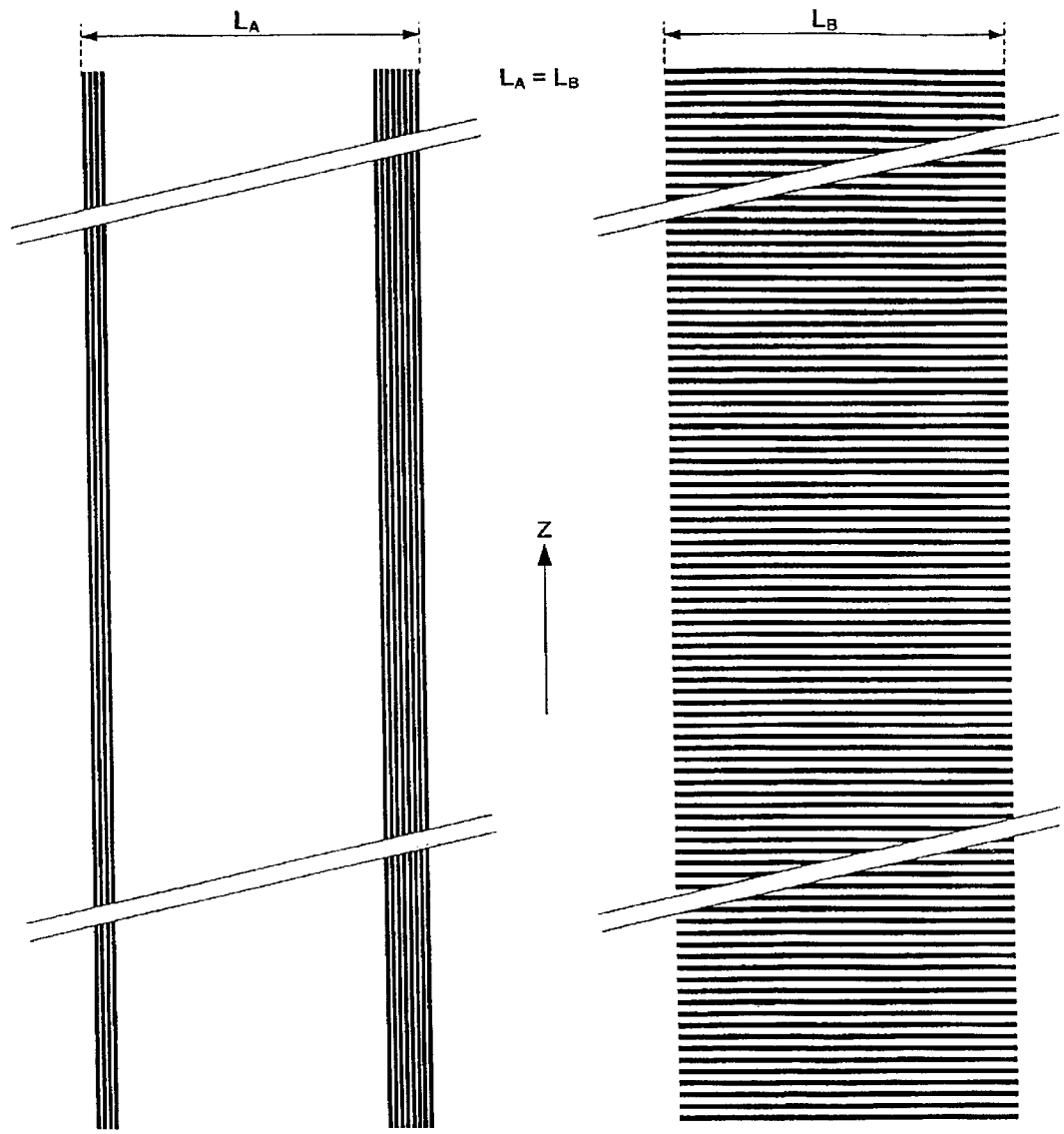
FIG. 10a shows two conductor structures whose conductors are oriented parallel to the z axis and from which part of the third embodiment of an inventive resonator is produced.
FIG. 10b shows a conductor structure whose conductors are oriented perpendicular to the z axis and from which part of the third embodiment of an inventive resonator is produced.

As an example for the third embodiment, an NMR resonator of the type of FIG. 10a of the patent [1] shall be constructed. It is also based on three Z structures, namely two structures with conductor elements parallel to the $B_0$ field (FIG. 10a) and a third with conductor elements perpendicular to the $B_0$ field (FIG. 10b). The two conductor structures in FIGS. 10a and 10b are shown separately, however, they are disposed exactly on top of each other such that the conductor elements intersect and overlap.

The object is now to distribute the above-described conductor elements onto two surfaces such that all intersections or overlappings disappear thereby producing a functional RF resonator.

The predominantly field-generating portions of the RF resonator are derived from the first Z structure on the left in FIG. 10a which is positioned closest to the measuring sample. The capacitive portions are derived from the second structure on the right in FIG. 10a, with the second Z structure having twice as many conductors as the first to realize the capacitive portion of the RF resonator.

The transverse connections of the RF resonator are derived from the third Z structure (FIG. 10b). The width $L_B$ of this Z structure equals the width $L_A$ of the two Z structures of FIG. 10a, i.e. the three Z structures exactly overlap one another.

Figure 11A:
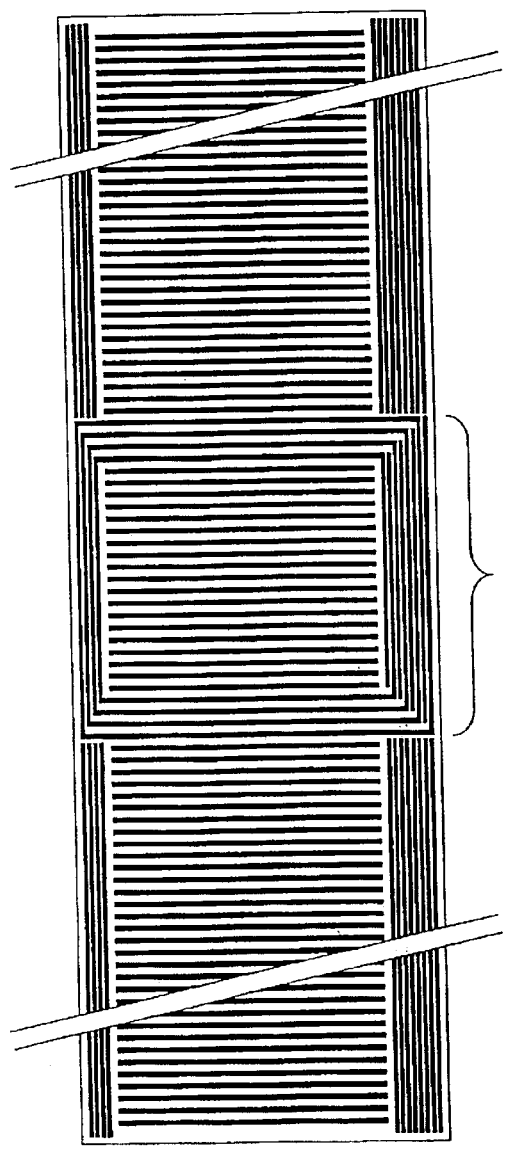
FIG. 11a shows a conductor structure on the first of the two surfaces of the third embodiment of an inventive resonator. The substrate contains the RF resonator 7d and the main portion of the compensation arrangement.
Figure 11B:
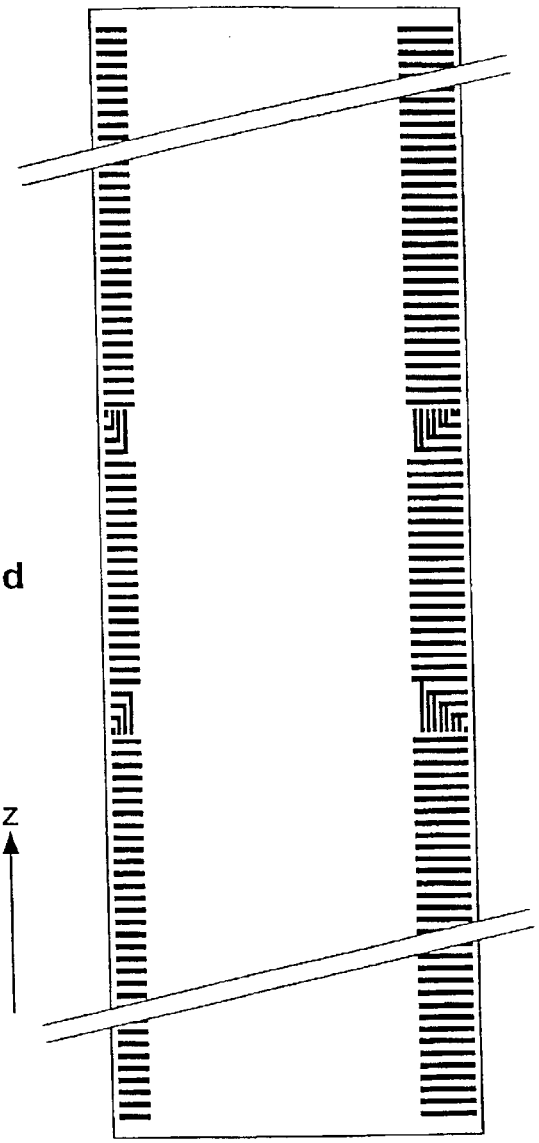
FIG. 11b shows the conductor structure of the second of the two surfaces of the third embodiment of an inventive resonator. This conductor structure realizes the residual part of the compensation arrangement. It cannot be mounted on the first surface since different conductors would then intersect or overlap one another.

FIGS. 11a and 11b show the distribution of these three Z structures on the two surfaces. The first surface (FIG. 11a) contains the entire RF resonator and the main portion of the conductor structure for compensating the susceptibility of the conductors. The second surface (FIG. 11b) contains the other conductor structures for compensating the residual susceptibility. It should be noted that the conductor structures have no intersections or overlappings on the two surfaces. The two combined conductor structures of FIGS. 11a and 11b are practically identical to the two combined conductor structures of FIGS. 10a and 10b except for a negligible error due to the finite separation between the two surfaces. We know that the original conductor structures (FIGS. 10a and 10b) generate no $B_z$ component in the active measuring volume, which is also true for the new conductor structures (FIGS. 11a and 11b) on the two surfaces.

The third embodiment is advantageous in that it offers more possibilities to design new conductor structures for the RF receiver coil arrangements. Disadvantageously, two individual support elements or one support element coated on both sides are required or their structures must be positioned exactly on top of each other.

Figures 2C, 2D:
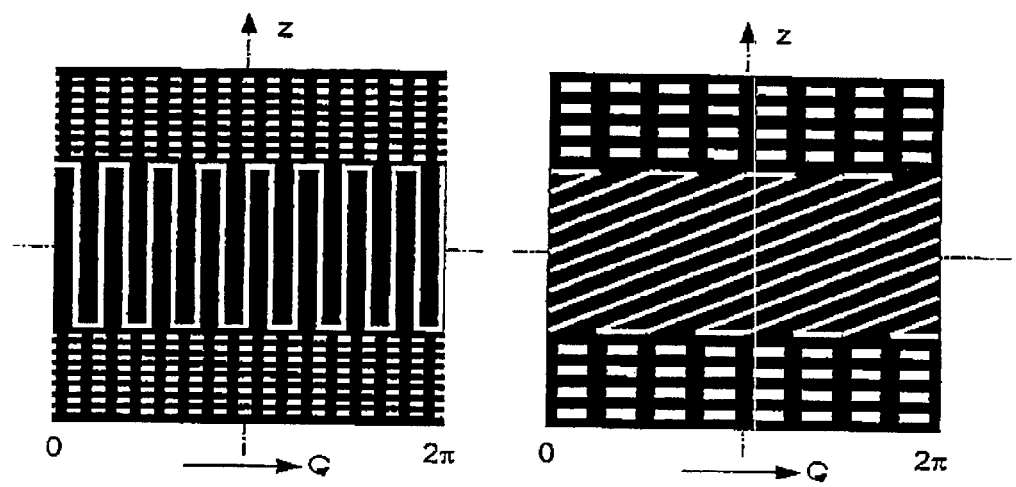
FIG. 2c shows an NMR resonator wherein the resonator consists of individual, mutually engaging fingers which mutually capacitively couple to construct, in total, a so-called birdcage resonator. The individual fingers are disposed parallel to the z axis, i.e. parallel to the $B_0$ field. The compensation structures are disposed above and below the finger arrangements. They are produced through mounting of a plurality of square holes and permit currents flowing parallel and also perpendicular to the z axis.
FIG. 2d corresponds to FIG. 2c, however having inclined fingers which are spirally wound about the cylinder surface through an angular region of $2\pi$. This arrangement is advantageous in that, for several mutually concentric arrangements, there is practically no RF coupling between the individual arrangements.
Figures 2E, 2F:
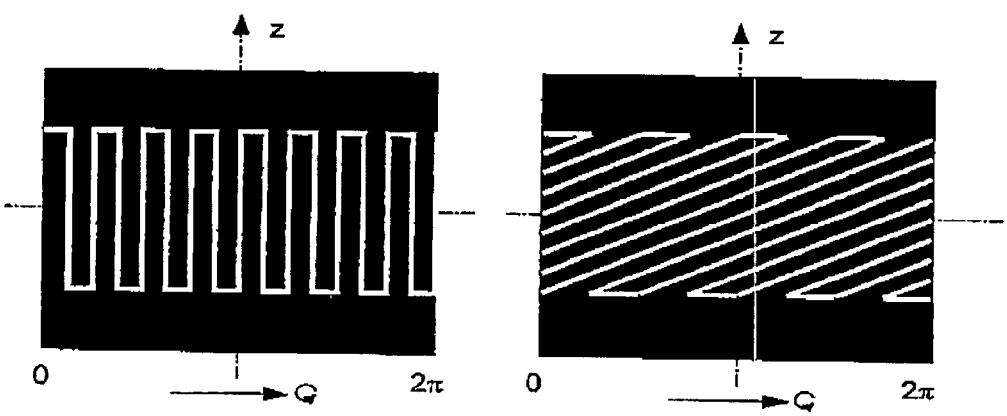
FIG. 2e corresponds to FIG. 2c, however without compensation structure. This arrangement corresponds to prior art.
FIG. 2f corresponds to FIG. 2d however without compensation structure. This arrangement corresponds to prior art.

Improvements on Known Resonators:

All findings described further above can also be used to improve the disturbance behavior of known resonators. FIG. 2e shows such a known NMR resonator which consists of individual fingers which mesh with each other, couple capacitively and represent in total a so-called birdcage resonator. It is clearly shown that the upper and lower region of the resonator has more mass per surface element than the region with the meshing fingers. To find an improvement, two measures can be taken.

1. The dimension of the resonator in the z direction is enlarged such that the upper and lower edge of the resonator moves further away from the active measuring volume. Magnetic monopoles are produced at these two edges which cannot be compensated for. To minimize their disturbing effect, they must be maximally separated from the active measuring volume.
2. To reduce the high mass concentration in the upper and lower region of the resonator, holes are cut out in these regions. They can have any shape, e.g. square or round, but must be distributed such that all surface elements in the entire resonator which differ only with respect to their z position, obtain a largely identical conductor mass. Additionally, the perforated region must permit currents parallel and also perpendicular to the z axis. These two measures greatly reduce the disturbing effect caused by the susceptibility of the conductor. FIG. 2c shows a resonator modified according to these instructions wherein the disturbing influence is much less than in the known resonator of FIG. 2e.

The same considerations are valid also for resonators with inclined fingers which are spirally wound over an angular region of $2\pi$ about a cylinder surface. FIG. 2f shows the uncorrected, and FIG. 2d the corrected resonator. This type of resonators have the advantage that they practically do not RF-couple with each other when they are positioned concentric to each other.

All procedures are now summarized with which the RF receiver coil arrangement can be built from the desired regions of the Z structures. The following procedures can be applied in accordance with the invention individually, in groups or all at the same time:

1. Rotating or displacing of conductor parts within small surface elements.
2. Bridging of small gaps between neighboring conductors.
3. Provision of small interruptions in the conductors.
4. Disassembling the Z structures and redistributing them onto two substrates to prevent intersections or overlappings on any of the substrates.

Figure 9B:
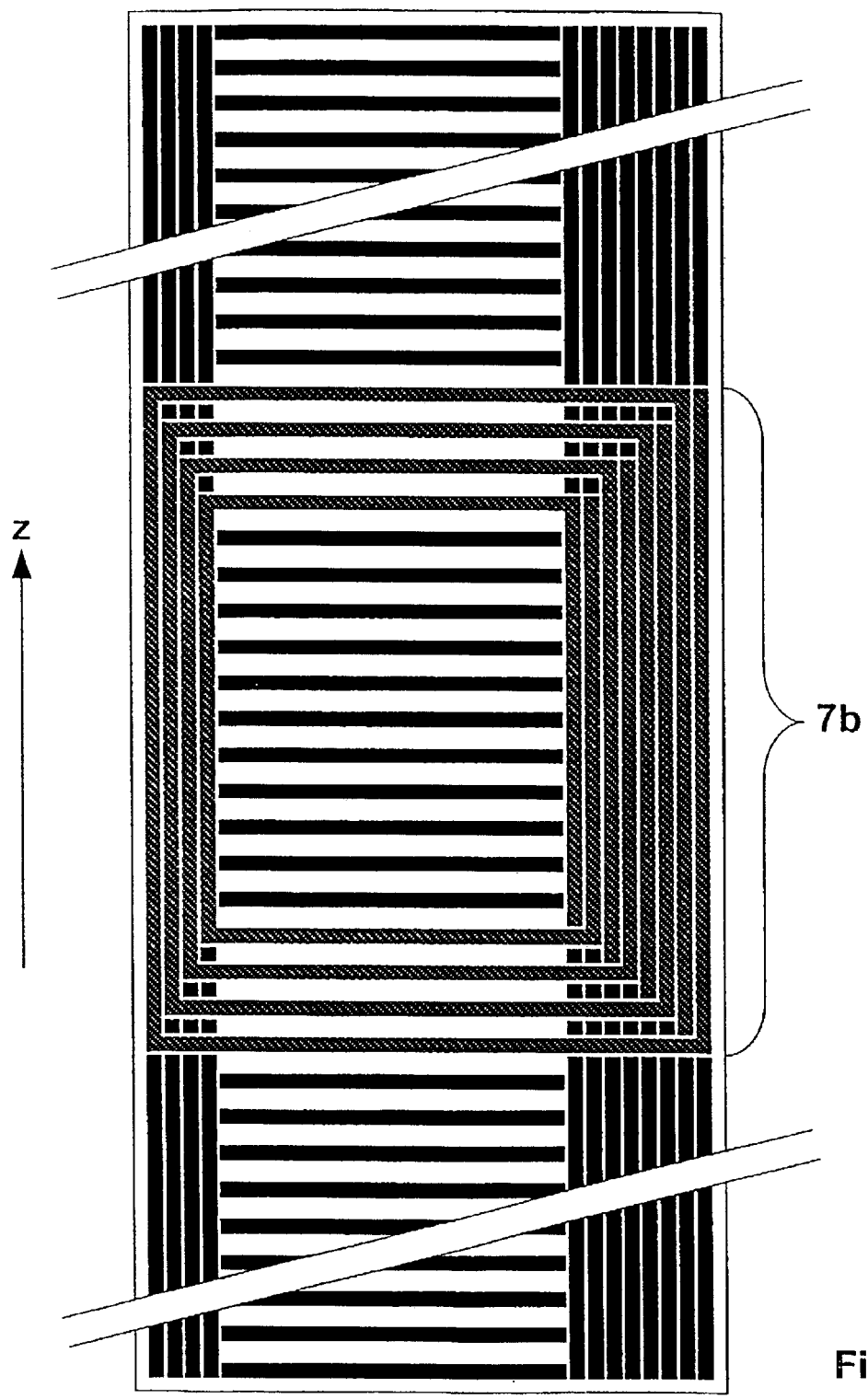
FIG. 9b shows the second embodiment of an inventive resonator produced from the hatched structure of FIG. 7b using the transformation process of FIG. 8a. The region 7b in which the RF current flows is hatched. The overall conductor structure produces practically no disturbing fields in the active measuring region.
Figure 9C:
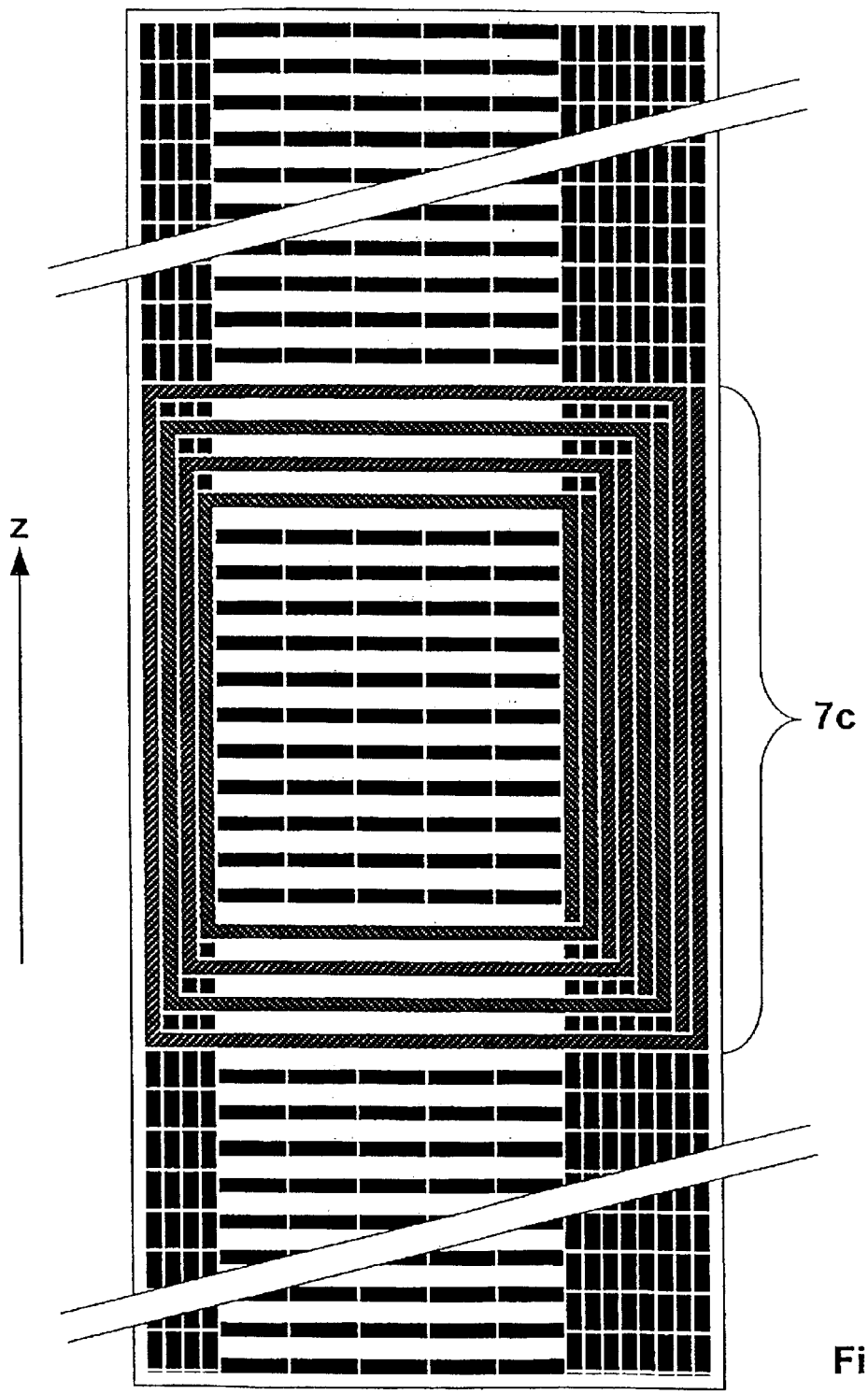
FIG. 9c shows again the second embodiment of the inventive resonator of FIG. 9b with the difference that the conductors of the compensation structure are subdivided which permits large reduction of the RF coupling between RF resonator and compensation structure.

The conductors of the compensation arrangement can be additionally provided with narrow interruptions to minimize the RF coupling to the RF resonator. Such interruptions are shown in FIG. 9c for the second embodiment (FIG. 9b). They can be realized in all other embodiments, although not explicitly shown therein.

The literature [2] moreover discloses an arrangement for at least partially reducing the disturbing effect on the NMR spectrum due to the susceptibility of the NMR resonator. This arrangement eliminates the field disturbances only along the z axis of the active measuring region but not within its entire volume. The present invention proceeds by two substantial steps and compensates for the field disturbances not only on a straight line and not only on a surface but within the entire volume of the active measuring region. This surprising result could not be directly derived from prior art but had to be found and developed along entirely new paths.

List of References for the Drawings

Letters:

| | |
|---|---|
| $B_0$ | static magnetic field of the NMR magnet |
| $\Delta B$ | disturbing field which is generated by the susceptibility of the conductor |
| $(\Delta B_z)_1$ | z component of the disturbing field $\Delta B$ caused by one single conductor strip 2 or 4 |
| $(\Delta B_z)_{tot}$ | z component of $\Delta B$ which is caused by all conductor strips of the arrangement 5 |
| S1, S3, S4, S5, S6 | individual conductor portions which are rotated and displaced within their surface elements to thereby produce the corners of the RF resonator |

Numbers:

| | |
|---|---|
| 1 | active measuring volume |
| 2 | long flat conductor whose longitudinal axis is oriented parallel to the $B_0$ field |
| 3 | magnetic dipoles within the strip 2 |
| 4 | flat conductor whose longitudinal axis is perpendicular to the $B_0$ field |
| 4a, 4b, 4c, ... 4k | conductor strips as described in 4 which belong to the conductor arrangement 5 |
| 5 | arrangement of several conductor strips 4a, 4b, 4c, ... 4k which are on a plane parallel to the $B_0$ field and disposed uniformly next to each other in the z direction |
| 6 | |
| 7a, 7b, 7c, 7d | regions of the various RF receiver coil arrangements in which the conductor sections are disposed which carry RF currents and belong to the RF resonator |
| 8a, 8b | Z structures with conductor elements which are oriented parallel to the $B_0$ field and are partially used to produce those conductor portions of the RF resonator which are closest to the active measuring region to produce the main portion of the RF field at that location |
| 9a, 9b | Z structures with conductor elements which are oriented perpendicular to the $B_0$ field and are partially used to produce the horizontal transverse connections at the top and bottom of the RF resonator |
| 10a, 10b | Z structures with conductor elements which are oriented parallel to the $B_0$ field and are partially used to produce the capacitive portions of the RF resonator. |

REFERENCES

[1] DE 101 18 835.8–33
[2] DE 34 14 559 A1

I claim:
1. An NMR (nuclear magnetic resonance) resonator system with at least one RF (radio frequency) resonator for emitting and/or receiving RF signals at one or more desired resonance frequencies to and/or from a measuring sample in an investigational volume of an NMR apparatus, disposed about a coordinate origin (x,y,z=0), with a means for producing a homogeneous magnetic field $B_0$ in the direction of a z axis, the resonator system comprising:

normally conducting conductor structures defining a resonator and acting Inductively and partially also capacitively, the conductor structures being disposed between $z=-|z_1|$ and $z=+|z_2|$ substantially on a z-invariant surface which is translation-invariant in a z direction at a radial (x,y) separation from the measuring sample; and a compensation arrangement disposed on said z-invariant surface, said compensation arrangement extending to values of at least $z<-|z_1|-0.5|r|$ and $z>+|z_2|+0.5|r|$, wherein $|r|$ is a minimum separation between the measuring sample and said compensation arrangement, said compensation arrangement having additional normally conducting conductor structures which are largely RF-decoupled from said RF resonator, said conductor structures of said compensation arrangement and of said RF resonator being composed of individual surface sections ("Z-structures") which comprise normally conducting structures disposed in said z-invariant surface to each extend along an entire length, in the z direction, of said conductor structures of said compensation arrangement and of said RF resonator, said Z-structures being disposed such that, with suitable conceptual decomposition of a surface at said Z structures into a plurality of small, equally sized surface elements, all surface elements which differ only with respect to their z position contain a largely identical mass of normally conducting material.

2. The resonator system of claim 1, wherein a total number of said surface elements is larger than 50.

3. The resonator system of claim 1, wherein a total number of said surface elements is larger than 200.

4. The resonator system of claim 1, wherein a number of said surface elements which differ with respect to their z position only is larger than 20.

5. The resonator system of claim 1, wherein a number of said surface elements which differ with respect to their z position only is larger than 50.

6. The resonator system of claim 1, wherein said conductor structures of said compensation arrangement project past both sides of said RF resonator by at least half of an extension of said RF resonator in the z direction.

7. The resonator system of claim 1, wherein said conductor structures of said compensation arrangement project past both sides of said RF resonator by approximately twice an extension of the RF resonator in the z direction.

8. An NMR resonator system comprising several serial receiver coil arrangements according to claim 1, wherein these RF receiver coil arrangements are RF-coupled to each other and lie on different partial surfaces of said z-invariant surface.

9. The resonator system of claim 1, wherein said conductor structures of said RF resonator which act inductively and partially also capacitively, and said conductor structures of said compensation arrangement are disposed on flat substrate elements which are parallel to each other and parallel to the z axis.

10. The resonator system of claim 1, wherein said conductor structures of said RF resonator which act inductively and partially also capacitively and said conductor structures of said compensation arrangement are disposed on cylindrical substrate elements which are concentric to each other and parallel to the z axis.

11. The resonator system of claim 1, wherein said conductor structures of said RF resonator which act inductively and partially also capacitively and said conductor structures of an associated said compensation arrangement are disposed in a same plane or on a same cylindrical surface.

12. The resonator system of claim 1, wherein said structures of said RF resonator and of an associated said compensation arrangement are disposed in at least two flat or cylindrical partial surfaces which are parallel or concentric to each other, wherein said inductively and partially also capacitively acting conductor structures of said RF resonator and parts of associated said conductor structures of said compensation arrangement are disposed in a first partial surface and remaining parts of said conductor structures of said compensation arrangement are disposed in other partial surfaces.

13. The resonator system of claim 12, wherein separations between said partial surfaces, measured in a direction perpendicular to said partial surfaces, are not more than 600 $\mu$m.

14. The resonator system of claim 12, wherein separations between said partial surfaces, measured in a direction perpendicular to said partial surfaces, are between 50 and 200 $\mu$m.

15. The resonator system of claim 1, wherein said conductor structures of said compensation arrangement and of said RF resonator are disposed on a same partial surface of said z-invariant surface.

16. The resonator system of claim 1, wherein at least a part of sections of said conductor structures are disposed in strips parallel or perpendicular to the z direction.

17. The resonator system of claim 1, wherein said structures on said z-invariant surfaces are composed of different geometrical shapes, of strips of different orientation and width, of squares, of circles, and/or of trapezoids.

18. The resonator system of claim 1, wherein at least one Z structure is bunt from identical, narrow conductors which are disposed in close proximity and with periodic continuity in the z direction, wherein a separation between neighboring conductors is small compared to a smallest separation from the volume under investigation.

19. The resonator system of claim 1, wherein at least one Z structure consists essentially of conductors which are oriented parallel to the z axis.

20. The resonator system of claim 1, wherein conductor structures which do not belong to said RF resonator have a number of narrow interruptions which are distributed over individual conductor sections.

21. The resonator system of claim 1, wherein said RF resonator is produced from desired regions of Z structures by rotating or displacing conductor or parts thereof within small surface elements of said Z structures, by galvanically connecting small separations between conductors, by generating interruptions in conductors, by inclining said Z structures, and/or by distributing said Z structures on two or more partial surfaces.

22. The resonator system of claim 1, wherein the system comprises three Z structures, two with vertical strips on a left and a right, and one with horizontal straight strips in a center.

23. The resonator system of claim 1, wherein the system comprises of three Z structures, a first and second structure each comprising strips disposed parallel to the z axis and a third structure with strips disposed periodically in z and transverse to the z axis, wherein said third Z structure is positioned over and exactly covering the first two said Z structures, wherein said first two Z structures have a defined mutual separation, said RF resonator and said compensation structure being generated by partially decomposing and redistributing said three Z structures over two separate partial surfaces of at least one substrate, wherein a first partial surface contains an entire said RF resonator and a main part of said compensation structure and a second partial surface contains a remaining part of said compensation structure, structures produced in this fashion being positioned on said two partial surfaces such that a sum of those structures is equal to a sum of said original three Z structures, to thereby produce an operative NMR resonator.

* * * * *